United States Patent [19]

Sakurai

[11] 4,333,991
[45] Jun. 8, 1982

[54] MAGNETIC GARNET FILM AND MANUFACTURING METHOD THEREFOR

[75] Inventor: Yoshifumi Sakurai, Minoo, Japan

[73] Assignee: Olympus Optical Co., Ltd., Tokyo, Japan

[21] Appl. No.: 258,005

[22] Filed: Apr. 27, 1981

[30] Foreign Application Priority Data

May 1, 1980 [JP] Japan .................................. 55-58400

[51] Int. Cl.$^3$ ........................ C04B 35/40; C30B 29/28
[52] U.S. Cl. ..................................... 428/702; 156/622;
156/DIG. 63; 156/DIG. 79; 156/DIG. 74;
427/128; 252/62.57
[58] Field of Search ............... 156/622, 621, DIG. 74,
156/DIG. 63, DIG. 79; 23/305 RE; 427/86,
128; 252/62.57; 428/702

[56] References Cited

U.S. PATENT DOCUMENTS

| | | | |
|---|---|---|---|
| 3,281,363 | 10/1966 | Geller et al. | 252/62.57 |
| 3,479,292 | 11/1969 | Chegwidden et al. | 252/62.57 |
| 3,654,162 | 4/1972 | Buhrer | 156/DIG. 79 |
| 3,764,195 | 10/1973 | Blank et al. | |
| 3,838,450 | 9/1974 | Bongers et al. | 156/DIG. 79 |
| 3,989,352 | 11/1976 | Lacklison et al. | |
| 4,256,531 | 3/1981 | Kimura et al. | 156/DIG. 63 |
| 4,293,371 | 10/1981 | Kokta et al. | 156/DIG. 63 |

FOREIGN PATENT DOCUMENTS

| | | |
|---|---|---|
| 2418711 | of 0000 | Fed. Rep. of Germany . |
| 48-20300 | 6/1973 | Japan .............................. 252/62.57 |
| 52-31703 | 3/1977 | Japan . |
| 1441353 | of 0000 | United Kingdom . |

Primary Examiner—Gregory N. Clements
Attorney, Agent, or Firm—Frishauf, Holtz, Goodman and Woodward

[57] ABSTRACT

Disclosed is a magnetic garnet film which has a composition $(BiGdLu)_3(FeAl)_5O_{12}$ or $(BiGdSm)_3(FeAl)_5O_{12}$.

9 Claims, 5 Drawing Figures

MAGNETIC GARNET FILM AND MANUFACTURING METHOD THEREFOR

The present invention relates to a magnetic garnet film used for photomagnetic recording and, more particularly, to a bismuth/rare earth/ferrogarnet film having a rectangular hysteresis characteristic.

With a ferromagnetic thin film such as a magnetic garnet film, it is possible to form, within the surface of the film which is spontaneously uniformly magnetized toward the S or N pole, small inverted magnetic domains having magnetic poles opposite to those of the rest of the film. It is thus possible to use a magnetic garnet film as a magnetic recording medium by establishing correspondence of the presence or absence of such inverted magnetic domains with binary codes. A recording medium using a magnetic thin film is disclosed as the prior art of such a magnetic recording medium in the Japanese Patent Disclosure No. 31703/77. This public disclosure involves the case wherein an amorphous Tb-Fe (terbium-iron) film is used. The Tb-Fe film has a large and stable coercive force near room temperature and has a low Curie temperature of about 150° C. This film is thus advantageous in that it requires only a little energy for writing of data. However, with a Tb-Fe film as shown in this disclosed publication, readout of the data by the Faraday effect, utilizing the rotation of the deflection plane of transmitted light, is almost impossible, since the optical figure of merit of the Tb-Fe film is extremely low. For this reason, the Kerr effect, utilizing the rotation of the deflection plane of reflected light, is used. However, the Kerr rotation angle $\theta k$ in this case is as small as 0.3°; it is thus very difficult to obtain a high S/N ratio (signal to noise ratio) during data readout. When this S/N ratio is not sufficiently high, errors caused by noise or the like are frequently involved in the readout data, providing problems in practice. In addition to this, the Tb-Fe film presents the problem of stability of the material, in terms of oxidation, crystallization, and mechanical strength, etc.

Instead of the Tb-Fe film as disclosed in the said publication and as described above, utilization of polycrystalline metal thin films such as MnBi (manganese/bismuth) or amorphous thin films such as GdFe (gadolinium/iron) has been conventionally proposed. However, magnetic thin film material such as MnBi has a high Curie temperature and thus requires much energy for writing of data. Amorphous metal thin films such as GdFe have practical problems of insufficient stability against oxidation, crystallization and the like. In addition to this, polycrystalline metal thin films such as MnBi and amorphous metal thin films such as GdCo, GdFe, and TbFe have inferior optical utility efficiency. This will be explained taking as an example photomagnetic recording utilizing a laser beam. Both polycrystalline metal thin films and amorphous metal thin films have magnetic anisotropy in the direction perpendicular to the surface plane of the film, and their coercive force is temperature-dependent. During recording, the laser beam is focused by a lens to form a laser spot on the surface of the film, and the coercive force of the film in the region of the spot is lowered by the resultant heating. Next, the magnetic field corresponding to the data to be written is applied to this region of lowered coercive force, to write the desired data therein. For reproduction, this region is irradiated by a laser beam polarized by a polarizer, and the data is read out utilizing the magnetic Kerr effect according to which the angle of polarization or deflection of the reflected light varies in compliance with the magnetization condition. Since the transmittance of light is inferior with both of these thin films, readout of the data utilizing the Faraday effect is practically impossible. Since the Kerr rotation angle during readout of the data utilizing the Kerr effect is at most 0.3° to 0.4°, the S/N ratio cannot be made sufficiently high.

The present inventor has conducted various experiments and studies to overcome these problems. As a result of this, a method has been established for controlling the photomagnetic characteristics (the wavelength dependency of the specific Faraday rotation, the absorption coefficient, and so on), the coercive force, the compensation temperature, the Curie temperature and so on by varying the kind and ratio of the rare earth elements in the magnetic thin film, the ratio of Bi substitution with respect to the rare earth elements, the crystal growing temperature, and so on.

The present invention has been made in consideration of this and has for its object to provide a magnetic garnet film on which writing of data is possible with an electromagnetic wave having a wavelength within the visible range, and transmittal reading of the data at a high S/N ratio is possible with an electromagnetic wave having a wavelength in the near-infrared region.

In order to achieve this and other objects, the present invention provides a magnetic garnet film having a composition represented by the chemical formula $(BiGdLu)_3(FeAl)_5O_{12}$ or $(BiGdSm)_3(FeAl)_5O_{12}$.

With a photomagnetic recording medium using the magnetic garnet film of the above composition, a practical semiconductor laser may be utilized for reading or writing (recording/reproducing). For example, it is possible to use an electromagnetic wave of 6,000 Å wavelength (visible light) for recording, and an electromagnetic wave of 8,300 Å wavelength (near-infrared light) for reproduction. The material for the practical semiconductor laser may include GaSe (with an oscillation wavelength of about 5,900 Å), GaAs (about 8,300 to 9,100 Å), and InGaAs (about 8,500 to 31,000 Å). The magnetic garnet film of the above composition is transparent and has good optical characteristics. Thus, this film has a large absorption coefficient within the visible range, so writing of data is easy. This film further has a large optical figure of merit within the near-infrared range, so the transmittal reading of data with a high S/N ratio may be possible. In addition to this, the magnetic garnet film of the above composition has a rectangular hysteresis characteristic and exhibits good values of coercive force, compensation temperature, and Curie temperature, thereby providing an excellent digital recording medium. Furthermore, the magnetic garnet film of the above composition may be of multilayered structure (e.g., bi-layered) incorporating a photoelectric film such as a CdS film (cadmium sulfide). In this case, the energy required for writing the data is reduced in comparison with the case of the garnet film alone, thereby facilitating the writing of the data. It is also possible to write the data at the compensation temperature or at the Curie temperature.

This invention can be more fully understood from the following detailed description when taken in conjunction with the accompanying drawings, in which.

The properties of the magnetic garnet film of the present invention will be described with reference to the attached drawings. The magnetic garnet film may be a single crystal, represented by the general chemical formula $(BiGdLu)_3(FeAl)_5O_{12}$ or $(BiGdSm)_3(FeAl)_5O_{12}$. Although the following description will be made with reference to a magnetic garnet film having the composition $(Bi_{0.3}Gd_{2.1}Lu_{0.6})_3(Fe_{4.2}Al_{0.8})_5O_{12}$, magnetic garnet films of other component ratios and the magnetic garnet film of the formula $(BiGdSm)_3(FeAl)_5O_{12}$ are also within the contemplated scope of the present invention. BiGdLu (or BiGdSm) will hereinafter be referred to as R for brevity.

Figure 1:
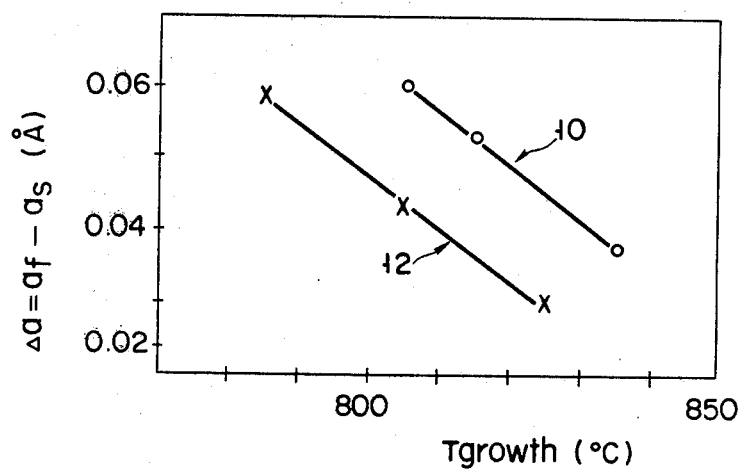
FIG. 1 is a graph showing the relationship between the growth temperature $T_{growth}$ (°C.) and the mismatch amount Δa (Å) of the lattice constant of the magnetic garnet film according to an embodiment of the present invention, which is formed on a $Gd_3Ga_5O_{12}$ (GGG) substrate by the liquid phase epitaxy method.

A magnetic garnet film $R_3(FeAl)_5O_{12}$ according to the present invention is grown on a $Gd_3Ga_5O_{12}$ (GGG) substrate by the liquid phase epitaxial growth method or the liquid phase epitaxy method (LPE method). Since this LPE method is generally known, the description thereof will be omitted. FIG. 1 shows the relationship between the growth temperature $T_{growth}$ (°C.) and the mismatch amount Δa (Å) of the lattice constant when the garnet thin film is formed on the substrate by the LPE method as mentioned above. Curve 10 represents the case wherein the substrate was rotated while the film was being formed by the LPE method, and curve 12 represents the case wherein the substrate was not rotated. The mismatch amount Δa may be represented as af-as, where "as" is the lattice constant of the substrate and "af" is the lattice constant of the garnet film. From FIG. 1, it is seen that the mismatch amount Δa decreases in inverse proportion to the growth temperature $T_{growth}$. In an $R_3(FeAl)_5O_{12}$ type of garnet film, the lattice constant "af" increases as the amount of substitution of Bi in the term R increases, and the lattice constant "af" decreases as the amount of Al in the term (FeAl) increases. This is attributable to the fact that the Bi atom is relatively large and the Al atom is relatively small. When the lattice constant "af" of the garnet film increases by the substitution of Bi, the specific Faraday rotation increases. However, when the mismatch amount Δa increases beyond a certain limit, problems such as degradation of sensitivity arise. Therefore, the mismatch amount Δa may be adjusted to a desired value by incorporating a suitable amount of Al in the garnet film. Bi, which increases the lattice constant of the $R_3(FeAl)_5O_{12}$ type film, more readily enters the material as the growth temperature $T_{growth}$ is lowered, and Al less readily enters the material as $T_{growth}$ is lowered. Bi also functions to lower the saturation magnetization $4\pi Ms$ of the film. The mismatch amount Δa may be suitably varied depending upon the composition of the garnet film, the crystal growth conditions, the required magnetic optical characteristics and so on. However, when taking the composition $(Bi_{0.3}Gd_{2.1}Lu_{0.6})_3(Fe_{4.2}Al_{0.8})_5O_{12}$ as an example, the mismatch amount Δa as shown in FIG. 1 is suitable. Furthermore, as shown in FIG. 1, the mismatch amount Δa may be made larger when the substrate is rotated (10) than the case wherein the substrate is not rotated (12) at the same temperature.

Figure 2:
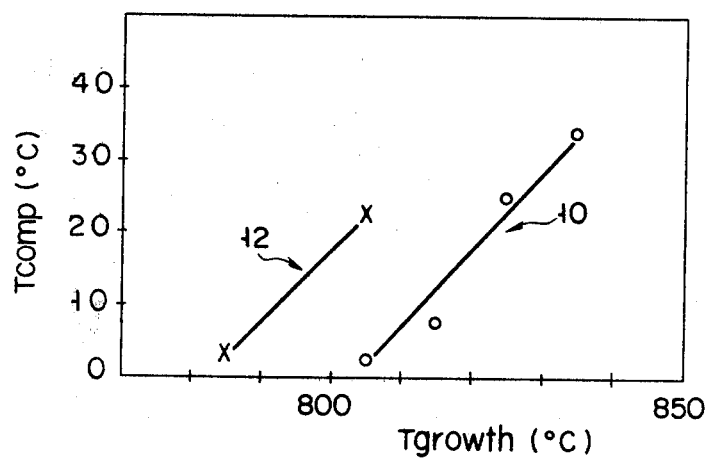
FIG. 2 is a graph showing the relationship between the compensation temperature $T_{comp}$ (°C.) and the growth temperature $T_{growth}$ (°C.) of the magnetic garnet film shown in FIG. 1.

FIG. 2 shows the relationship between the compensation temperature $T_{comp}$ (°C.) of the $R_3(FeAl)_5O_{12}$ garnet film of the composition described above and the growth temperature $T_{growth}$ (°C.) of the garnet film formed by the LPE method. As in the case of FIG. 1, curve 10 represents the case wherein the GGG substrate was rotated during growth of the crystals and curve 12 represents the case wherein the substrate was not rotated. From FIG 2, it is seen that the compensation temperature $T_{comp}$ increases substantially in proportion to the growth temperature $T_{growth}$. It can thus be seen from FIGS. 1 and 2 that it is possible to control both the mismatch amount Δa related to the optical characteristics such as the specific Faraday rotation and the compensation temperature $T_{comp}$ related to the magnetic characteristics, by controlling the growth temperature $T_{growth}$ of the single crystal garnet film and/or by rotating the substrate.

Figure 3:
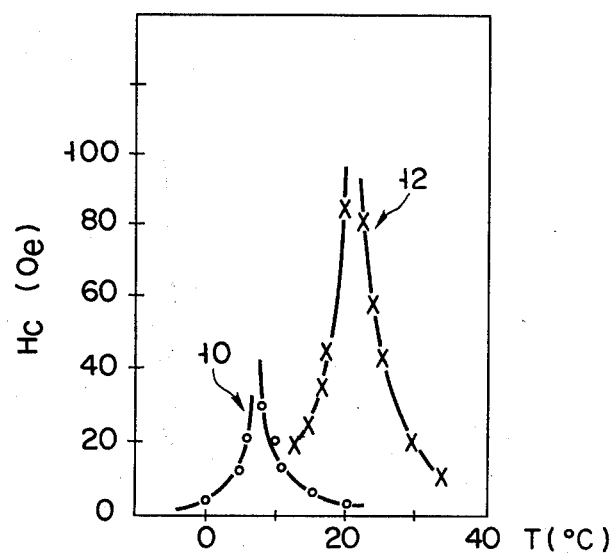
FIG. 3 is a graph showing the relationship between the coercive force Hc(Oe) and the temperature (°C.) of the magnetic garnet film shown in FIG. 1.

FIG. 3 shows the relationship between the coercive force Hc (Oe) and the film temperature (°C.) of the garnet film of the composition described above. It can be seen from FIG. 3 that the coercive force Hc has a singular point, that is, the maximum value of Hc with respect to the temperature T, and that this Hc characteristic varies depending on whether or not the substrate is rotated during the growth process of the crystals. It can further be seen from FIG. 3 that the singular point (compensation temperature) is high and is substantially at room temperature when the substrate is not rotated (12). This compensation temperature is lowered when the substrate is rotated (10). The compensation temperature may be freely controlled within the range of about −20° to +35° C. by suitably varying the growth temperature $T_{growth}$ and/or the content of gadolinium Gd in the garnet film.

Figure 4:
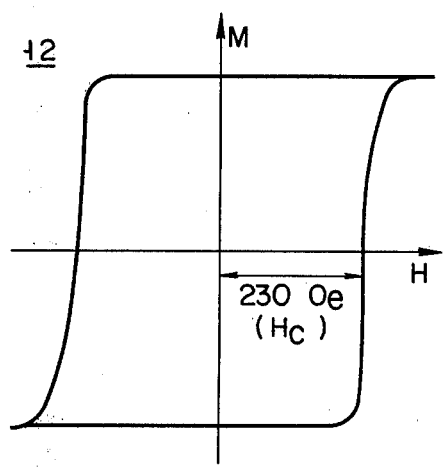
FIG. 4 is a graph showing the hysteresis characteristic of the magnetic garnet film corresponding to curve 12 of FIG. 3.

FIG. 4 shows the hysteresis characteristic of a garnet film at 24° C. for the case of curve 12 of FIG. 3. The coercive force in this case is about 230 Oe and shows a good rectangular hysteresis characteristic. When it is desired to increase and stabilize the coercive force of the garnet film, Sm may be substituted for the element Lu in the chemical formula $(BiGdLu)_3(Fe_{Al})_5O_{12}$. In this case, the coercieve force of the film can be made about 430 Oe. When the mismatch amount Δa becomes too big due to the influence of the Bi or Sm of large atomic size, the substrate for growing the garnet film thereon may be made of $Sm_3Ga_5O_{12}$(SmGG) or $Nd_3Ga_5O_{12}$(NdGG).

The Faraday rotation angle of the garnet film having the characteristics as shown in FIGS. 3 and 4 was measured to be $0.63 \times 10^4$ deg/cm for the laser beam of 6,328 Å wavelength. The film thickness of this garnet film was easily controllable within the range of about 0.5 μm to about 3 μm. With a garnet film of 3 μm thickness, a Faraday rotation angle of about 2° at the deflection plane is obtainable. This is a considerably better value than the Kerr rotation angle (about 0.3°) of the prior art amorphous magnetic thin film described above. In the case of this example, an improvement of about 16 dB in the S/N ratio may be realized. This indicates that an improvement of about 16 dB noise margin is possible for digital signal processing. Therefore, errors due to noise generated during readout of the data described above hardly occur. The figure of merit of the garnet film according to this example of the present invetnion is about b 5 degree/dB at 6,000 Å wavelength, about 900 degree/dB at 11,000 Å wavelength. Thus, the absorption of light within the wavelength range (about 8,300 to 9,100 Å) of the GaAs semiconductor laser is extremely small. Accordingly, the magnetic optical characteristics of the garnet film are excellent in practice. The figure of merit (degree/dB) as described above is defined as the ratio of the Faraday rotation angle (degree) to the absorption constant (dB) and represents the practical standard for utilizing the Faraday effect in practice. Although this figure of merit does not have much significance physically, the greater this value (degree/dB), the better the characteristics of the garnet film.

When performing the writing of data on the garnet film using a laser beam, a laser beam of a suitable wavelength is used considering the figure of merit described above. When it is important to secure a large Faraday rotation angle during reading of data, writing is performed with a laser beam of relatively short wavelength and reading is performed with a laser beam of relatively long wavelength. As a method which does not utilize the temperature dependence of the coercive force during writing of the data, it is possible to use a monopole magnetic head for writing and a laser beam of relatively long wavelength for reading out the data. Various semiconductor materials for semiconductor lasers are known which provide various laser beam wavelengths. For example, a ZnS laser has an oscillation wavelength of about 3,300 Å and a PbSnSe laser provides a laser beam of about 80,000 to 312,000 Å wavelength.

Figure 5:
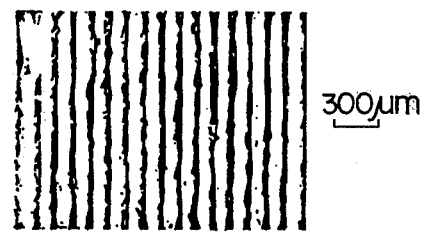
FIG. 5 is view showing the magnetic pattern when printing is performed on the magnetic garnet film shown in FIG. 1.

Although the above description has been made with reference to optical magnetic recording or reproduction, the garnet film according to the present invention may be similarly applicable to printing of data. FIG. 5 shows an example of a data pattern printed from a recorded magnetic tape as observed with a vertical illuminating type polarizing microscope. When the data pattern of this magnetic tape is printed on a conventional amorphous magnetic film, the printed pattern is observed utilizing the Kerr effect with a reflex type polarizing microscope. In contrast with this case, the printed pattern shown in FIG. 5 shows great contrast, and the garnet film according to the present invention is confirmed to have superior optical characteristics.

The present inventor selected some of the garnet films having substantially the same characteristics as those of FIGS. 3 and 4 and measured the Curie temperature. The Curie temperature of these garnet films was confirmed to be about 180° C. This Curie temperature may further be lowered by varying the content of Al (component ratio within the composition) of the garnet films. This Curie temperature, 180° C., is considerably lower than the Curie temperature of the MnBi film (about 360° C.) It is seen from this that the energy required for writing data may be made smaller.

As for the manufacture of the magnetic garnet film, the growth process technique of the substrate has been perfected and it has become easy to manufacture a GGG substrate without lattice defects. Although the material cost of the substrate becomes higher as compared with semiconductor elements, the manufacturing process is, on the other hand, easier. From the overall point of view, the garnet film of the present invention presents sufficient advantages for mass production.

The magnetic garnet film according to the present invention is not only suitable for mass production but has advantageous optical characteristics over the conventional materials of the same type in that it is transparent and has a large angle of polarization or deflection and also writing of data is possible with a relatively low energy.

The particular examples as described in the present specification do not limit the scope of the present invention. It is therefore to be understood that various modifications and changes may be made without departing from the spirit and scope of the present invention. For example, in the formula $(Bi_aGd_bLu_c)_3(Fe_dAl_e)_5O_{12}$, in the above example, $a=0.3$, $b=2.1$, $c=0.6$, $d=4.2$, and $e=0.8$. However, the values of the component ratios may be arbitrarily selected as long as the relations $a+b+c=3$ and $d+e=5$ hold. Although the characteristics of the garnet film obtained vary according to these ratios, the magnetic garnet films will fulfill the object of the present invention unless any of these ratios becomes 0. Furthermore, the garnet film according to the present invention may also be applied to a magnetic bubble memory device or the like. Thus, cylindrical magnetic domains or bubble magnetic domains may be formed within the film by applying a vertical bias magnetic field Hb of a suitable magnitude to the surface of the film under the condition $Is/\mu_0 < Ha$ where Ha (A/m) is the magnetic anisotropy of the garnet film and Is is the spontaneous magnetization.

What is claimed is:

1. A magnetic garnet film having a composition selected from the group consisting of $(BiGdLu)_3(FeAl)_5O_{12}$ and $(BiGdSm)_3(FeAl)_5O_{12}$.

2. A magnetic garnet film according to claim 1, wherein said garnet film is composed of a single crystal grown on a substrate having a composition selected from the group consisting of $Gd_3Ga_5O_{12}$, $Sm_3Ga_5O_{12}$, and $Nd_3Ga_5O_{12}$.

3. A magnetic garnet film according to claim 1 or 2, wherein said garnet film is layered on a photoelectric film.

4. A process for growing a magnetic garnet film comprising growing a single crystal garnet having a composition selected from the group consisting of $(BiGdLu)_3(FeAl)_5O_{12}$ and $(BiGdSm)_3(FeAl)_5O_{12}$ on a substrate having a composition selected from the group consisting of $Gd_3Ga_5O_{12}$, $Sm_3Ga_5O_{12}$, and $Nd_3Ga_5O_{12}$.

5. A process according to claim 4, wherein said single crystal is grown by the liquid crystal epitaxy growth method.

6. A process according to claim 5, wherein said substrate is rotated while growing said single crystal for controlling the maximum coercive force temperature.

7. A garnet film manufactured by a process according to any one of claims 4 to 6.

8. A magnetic garnet film having a composition selected from the group consisting of $(BiGdLu)_3(FeAl)_5O_{12}$ and $(BiGdSm)_3(FeAl)_5O_{12}$, said garnet film being composed of a single crystal grown on a substrate having a composition selected from the group consisting of $Gd_3Ga_5O_{12}$, $Sm_3Ga_5O_{12}$ and $Nd_3Ga_5O_{12}$, and being multilayered with a photoelectric film.

9. A process for growing a magnetic garnet film comprising growing by the liquid crystal epitaxy growth method a single crystal garnet having a composition selected from the group consisting of $(BiGdLu)_3(FeAl)_5O_{12}$ and $(BiGdSm)_3(FeAl)_5O_{12}$ on a substrate having a composition selected from the group consisting of $Gd_3Ga_5O_{12}$, $Sm_3Ga_5O_{12}$, and $Nd_3Ga_5O_{12}$, said substrate being rotated while growing said single crystal for controlling the maximum coercive force temperature.

* * * * *